United States Patent
Elboim et al.

(10) Patent No.: US 11,342,258 B2
(45) Date of Patent: May 24, 2022

(54) ON-DIE CAPACITOR

(71) Applicant: Wiliot, Ltd., Caesarea (IL)

(72) Inventors: Yaron Elboim, Haifa (IL); Alon Yehezkely, Haifa (IL)

(73) Assignee: Wiliot Ltd., Caesarea (IL)

( * ) Notice: Subject to any disclaimer, the term of this patent is extended or adjusted under 35 U.S.C. 154(b) by 188 days.

(21) Appl. No.: 16/523,015

(22) Filed: Jul. 26, 2019

(65) Prior Publication Data

US 2020/0286821 A1 Sep. 10, 2020

Related U.S. Application Data

(60) Provisional application No. 62/815,092, filed on Mar. 7, 2019.

(51) Int. Cl.
| | |
|---|---|
| *H01L 23/50* | (2006.01) |
| *H01L 23/64* | (2006.01) |
| *H02M 3/07* | (2006.01) |
| *H02J 50/80* | (2016.01) |
| *G06F 1/26* | (2006.01) |
| *G01R 19/165* | (2006.01) |
| *H02J 50/05* | (2016.01) |
| *H02N 2/18* | (2006.01) |

(52) U.S. Cl.
CPC ........ *H01L 23/50* (2013.01); *G01R 19/16595* (2013.01); *G06F 1/26* (2013.01); *H01L 23/642* (2013.01); *H02J 50/05* (2016.02); *H02J 50/80* (2016.02); *H02M 3/07* (2013.01); *H02N 2/188* (2013.01)

(58) Field of Classification Search
CPC ........ H01L 23/642; H01L 23/50; H02J 50/05; H02J 50/001
See application file for complete search history.

(56) References Cited

U.S. PATENT DOCUMENTS

| | | | |
|---|---|---|---|
| 5,369,545 | A | 11/1994 | Bhattacharyya et al. |
| 2009/0152954 | A1 | 6/2009 | Le et al. |
| 2009/0174361 | A1 | 7/2009 | Duron et al. |
| 2010/0301699 | A1* | 12/2010 | Zhang ..................... H02N 1/08 310/300 |

(Continued)

FOREIGN PATENT DOCUMENTS

| | | | |
|---|---|---|---|
| DE | 2413173 A1 * | 10/1975 | ........ H02M 3/33515 |
| WO | 2006046937 A1 | 5/2006 | |

OTHER PUBLICATIONS

Faltus, et al., "Storage Capacitor Properties and Their Effect on Energy Harvester Performance," Czech Republic, A Kyocera Group Company, Published Feb. 2019, url.: https://www.avx.com/docs/techinfo/Storage_Capacitor_Properties_Effect_Energy_Harvester_Performance.pdf.

(Continued)

*Primary Examiner* — Fernando L Toledo
*Assistant Examiner* — Valerie N Newton
(74) *Attorney, Agent, or Firm* — M&B IP Analysts, LLC

(57) ABSTRACT

According to the disclosed embodiments, an on-die capacitor utilized in energy-harvest based circuits is provided. In the disclosed design, the harvester is coupled to the on-die capacitor, thus there is no need to provide power interfaces and semi-conductor devices external to the IC. The disclosed design of the on-die capacitor would reduce the overall size and cost of the IC.

10 Claims, 7 Drawing Sheets

(56) References Cited

U.S. PATENT DOCUMENTS

2012/0119326 A1* 5/2012 Sugisaki ................ H01G 4/005
  257/532
2017/0288012 A1* 10/2017 Cheon ..................... H01L 28/55

OTHER PUBLICATIONS

Wu, et al., "A 66pW Discontinuous Switch-Capacitor Energy Harvester for Self-Sustaining Sensor Applications," Published online 2016, url.: https://www.ncbi.nlm.nih.gov/pmc/articles/PMC5381925, University of Michigan, Ann Arbor, MI.

* cited by examiner

ON-DIE CAPACITOR

CROSS-REFERENCE TO RELATED APPLICATIONS

This application claims the benefit of U.S. Provisional Application No. 62/815,092 filed on Mar. 7, 2019, the contents of which are hereby incorporated by reference.

TECHNICAL FIELD

The present disclosure relates generally to utilizing on-die capacitors as a single direct current (DC) source in integrated circuits.

BACKGROUND

All electronic devices require a power source to operate. Even low-drain devices, such as low-power Internet of Things (IoT) sensors that are designed to support low power communication protocols, operate using a small power source, e.g., a coin battery. The reliance on a power source such as a battery is a limiting factor for electronic devices due to cost, size, lack of durability to environmental effects, required frequent replacement, and the like.

As an alternative to batteries, power may be harvested from environmental sources, such as ambient light, mechanical or vibrational movement, wind power, and electromagnetic radiation, e.g., existing radio frequency transmissions. The harvested power is stored in a super capacitor or a rechargeable battery, and typically managed by a power management unit (PMU). A PMU is a circuit that performs general circuit power related operations, such as supply regulation, voltage and current references, power on indication, brown-out indication, power modes control, management of power storage units, and more.

In a conventional design of power harvest-based integrated circuits, the power is stored in a super capacitor or a rechargeable battery that is exterior to the IC (i.e., the die). Such a design is schematically demonstrated in FIG. 1, where a diagram of a passively powered sensor 100 is shown. An integrated circuit (IC) 120 is powered by energy harvested by a harvester 121 coupled to a PMU 122, and various electronic circuits 123 designed to perform the various computing functions of the chip. The energy harvesting can be form energy sources, such solar, RF signals, piezoelectric signals, and the like.

In the schematic diagram illustrated in FIG. 1, the sensor 100 has a capacitor 130 connected to the harvester 121 for receiving and holding harvested power and providing that power to the IC 120 when needed. As shown in FIG. 1, the capacitor 130 is connected outside of the IC 120, and is housed outside of the die, which is a small block of semiconductor material on which a given functional circuit, such as the IC, is fabricated. Typically, ICs are produced in large batches on a single wafer of semiconductor material through various processes such as photolithography. The wafer is cut ("diced") into many pieces, each containing one copy of the circuit. Each of these pieces is called a die.

The power source, e.g., a capacitor or a rechargeable battery, is connected outside of the die due to its physical size. For example, the area occupied by a super capacitor or a coin battery may approximate a few square-millimeters. Because of their size, such elements cannot be fabricated as part of the IC, in particular when using today's submicron fabrication technologies. As such, relaying on a power source connected outside of the die increases the overall physical dimensions of the chip. Further, an external power source may be more likely to fail, as it often requires additional components. For IoT devices and sensors, this may be a significant limiting factor.

It would therefore be advantageous to provide a solution that would overcome the challenges noted above.

SUMMARY

A summary of several example embodiments of the disclosure follows. This summary is provided for the convenience of the reader to provide a basic understanding of such embodiments and does not wholly define the breadth of the disclosure. This summary is not an extensive overview of all contemplated embodiments, and is intended to neither identify key or critical elements of all embodiments nor to delineate the scope of any or all aspects. Its sole purpose is to present some concepts of one or more embodiments in a simplified form as a prelude to the more detailed description that is presented later. For convenience, the term "certain embodiments" may be used herein to refer to a single embodiment or multiple embodiments of the disclosure.

Certain embodiments disclosed herein include an on-die capacitor for an Internet of Things (IoT) device, including: an integrated circuit disposed on a die; a power management unit; and an on-die capacitor, wherein the capacitor further comprises a first metal plate, a second metal plate, and a dielectric material placed therebetween, wherein the capacitor is integral to the die.

Certain embodiments disclosed herein also include an on-die capacitor comprising: a first metal plate; a second metal plate; and a dielectric material placed therebetween the first metal plate and the second metal plate, wherein the on-die capacitor is integral to the die.

BRIEF DESCRIPTION OF THE DRAWINGS

The subject matter that is regarded as the invention is particularly pointed out and distinctly claimed in the claims at the conclusion of the specification. The foregoing and other objects, features, and advantages of the invention will be apparent from the following detailed description taken in conjunction with the accompanying drawings.

DETAILED DESCRIPTION

Figure 1:
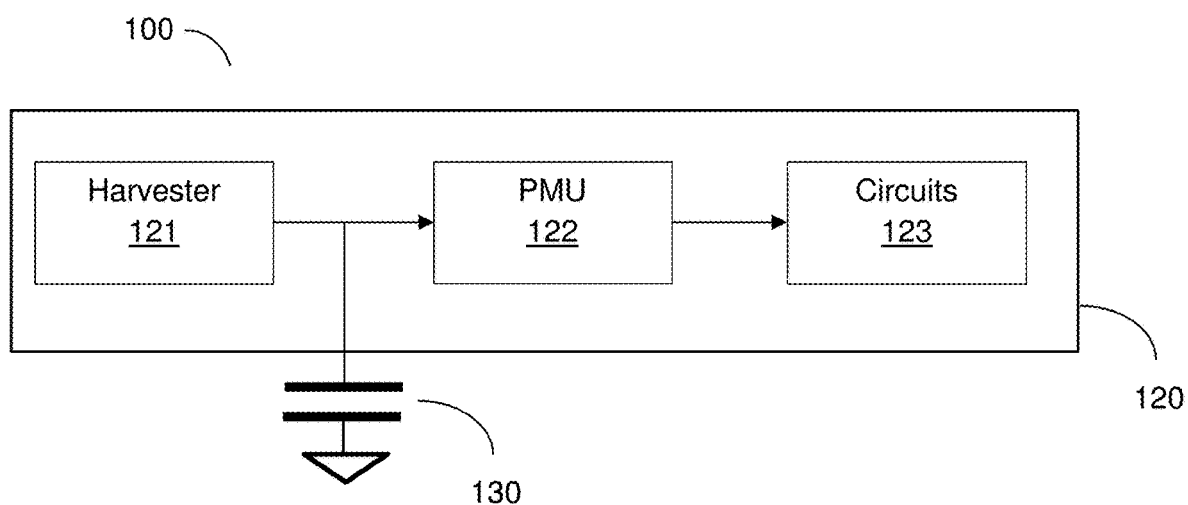
FIG. 1 illustrates a schematic diagram of a conventional harvester-based IC.

It is important to note that the embodiments disclosed herein are only examples of the many advantageous uses of the innovative teachings herein. In general, statements made in the specification of the present application do not necessarily limit any of the various claimed embodiments. Moreover, some statements may apply to some inventive features but not to others. In general, unless otherwise indicated, singular elements may be in plural and vice versa with no loss of generality. In the drawings, like numerals refer to like parts through several views.

According to the disclosed embodiments, an on-die capacitor utilized in energy-harvest based circuits is provided. In the disclosed design, the energy harvester is coupled to the on-die capacitor, and there is no need to provide a separate power source external to the IC. This allows for the reduction of the overall size and cost of the IC.

Figure 2:
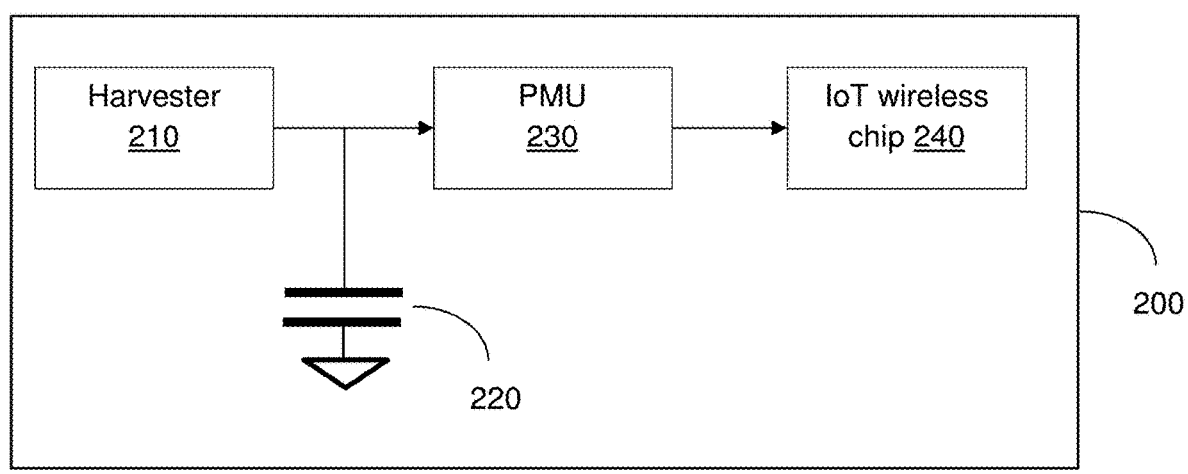
FIG. 2 illustrates a schematic diagram of an energy harvester-based IC designed according to an embodiments.

FIG. 2 shows an example schematic diagram of an energy harvester-based IC 200 designed according to an embodiment. The IC 200, as schematically demonstrated in in FIG. 2, includes an energy harvester 210 coupled to an on-die capacitor 220, a power management unit (PMU) 230, and an IoT wireless chip 240. The IoT wireless chip 240 represents various electronic circuits (such as a memory, a logic, a RF transceiver, etc.) configured to perform various functions of the indented system. As an example, the IoT wireless chip 240 may serve the function of a wireless IoT device or sensor. As such, the IC 200 may be designed to communicate using a low power communication protocol. Examples for such a protocol include, but are not limited to, Bluetooth Low Energy (BLE), Bluetooth®, LoRa, Wi-Gi®, nRF, DECT®, Zigbee®, Z-Wave, EnOcean, and the like.

Typically, the wireless IoT chip 240 operates in different modes (e.g., scan, sleep, receive, transmit, and so on), where each such mode may require a different voltage level to power the various logic and RF components (not shown) of the wireless IoT chip 240. To this end, the energy harvester 210 is configured to provide multiple voltage levels to the wireless IoT chip 240 while maintaining a low loading DC dissipation value.

In an example implementation, the energy harvester 210 may include a voltage multiplier coupled to an antenna (not shown in FIG. 2). The voltage multiplier may be a low-voltage multiplier, such as a Dickson multiplier, while the antenna may be implemented as a receive/transmit antenna of the wireless IoT chip 240. That is, in such a configuration, the antenna is primarily designed to receive and/or transmit wireless signals according to the respective communication protocol of the wireless IoT chip 240 (e.g., 2.400-2.4835 GHz signal for BLE). Alternatively, the antenna may be designed solely for energy harvesting and operate in a different frequency band, direction, or both, than those defined in the standard of the communication protocol implemented in the IoT device. It should be noted that in both configurations energy can be harvested from any wireless signals received in the air. In other implementations, energy can be harvested from other environmental sources, such as solar energy, piezoelectric signals, wind, environmental vibrations, and the like.

The harvested energy is stored in the on-die capacitor 220. According to the disclosed embodiments, the on-die capacitor 220 is part of the IC 200, i.e., embedded within the die. In an embodiment, the on-die capacitor 220 is a metal capacitor form comprising multiple metal layers with at least one dielectric layer. In a typical IC fabrication process, once the semiconductor devices (e.g., the transistors) are formed on the substrate, they are then interconnected to form the desired electrical circuits. The interconnections are achieved using metal interconnecting layers, e.g., created on top of the substrate, that are isolated by dielectric layers. A traditional capacitor contains at least two electrical conductors often in the form of metallic plates separated by a dielectric medium.

According to the disclosed embodiments, the on-die capacitor 220 is created by using metal layers as the metallic plates and the dielectric layers as the dielectric medium of the capacitor, where the metal layers and the dielectric layers are integral to the die on which the IC is disposed. In an embodiment, in order to minimize the die size area, a maximum number of metal layers created in the IC fabrication process are utilized. In areas containing circuits (e.g., semiconductor devices), the metal layers above such circuits are used as additional metal layers for the on-die capacitor 220. Schematic diagrams illustrating the on-die capacitor 220 are provided below in FIGS. 3A-3C.

The PMU 230 is coupled to the on-die capacitor 220, and is configured to regulate the power to the chip 240. Specifically, as the capacitance of the on-die capacitor 220 is very limited, the power consumption must be carefully maintained. This maintenance is performed in order to avoid draining the capacitor 220, and thus resetting the IoT wireless chip 240. In an embodiment, the PMU 230 can be realized using a Schmitt trigger that operates on a predefined the threshold (Vref), e.g., Vref=0.85 V.

In another embodiment, the PMU 230 may be further configured to provide multi-level voltage level indications to the wireless IoT chip 240. Such indications allow the chip 240 to determine the state of a voltage supply at any given moment when the capacitor 220 charges or discharges. According to this embodiment, the PMU may include a detection circuitry controlled by a controller. The detection circuitry includes different voltage reference threshold detectors, where only a subset of such detectors are active at a given time to perform the detection. The controller determines which sub-set of detectors are activated at any given moment. An example implementation of a multi-level PMU 220 is discussed in U.S. application Ser. No. 16/176,460 to Yehezkely, now pending and assigned to the common assignee.

It should be appreciated that the wireless IoT chip 240 is provided as an example implementation without departing from the scope of the disclosed embodiments. That is, the disclosed design of the on-die capacitor can be utilized to serve as a power resource of each other circuits, regardless of their functionality.

Figure 3A:
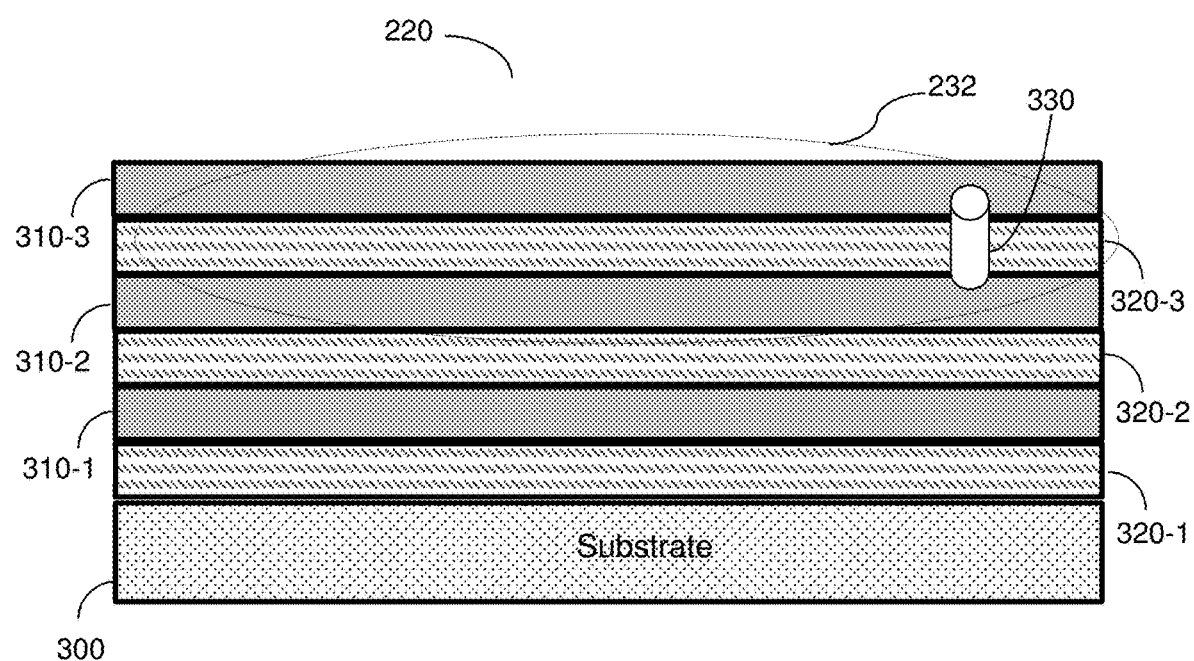
FIGS. 3A-3C are cross-section diagrams of interconnect layers showing the formation of the on-die capacitor.

FIG. 3A shows an example cross-section diagram of interconnected layers of the IC showing the formation of the on-die capacitor 220. The shown embodiment includes three metal layers 310-1 through 310-3 separated by dielectric layers 320-1 through 320-3. The first dielectric layer 320-1 is formed directly over a substrate 300, e.g., a CMOS substrate. It should be noted that the number of layers shown in FIG. 3A is for illustrative purposes only. The on-die capacitor 220 can be formed on die including any number of interconnecting layers. For example, some technologies includes more than 60 interconnecting layers.

The dielectric layers 320-1 through 320-3 may be comprised of SiO2, silicon oxycarbide, or other materials having a low dielectric constant. Such materials are typically characterized by a permittivity, or dielectric constant, within the range of 2.7-3.82.

In one embodiment, the on-die capacitor 220 is formed by using the entirety of two metal layers 310-2 and 310-3 as a first metal plate. As illustrated in FIG. 3A, a first metal plate 232 of the on-die capacitor 220 is formed from the top metal layers 310-2 and 310-3, respectively, which are connected using a via 330. The second metal plate may be a non-via connected third meta layer 310-1. The dielectric layer 320-2 is employed as the dielectric medium of the capacitor 220.

Figure 3B:
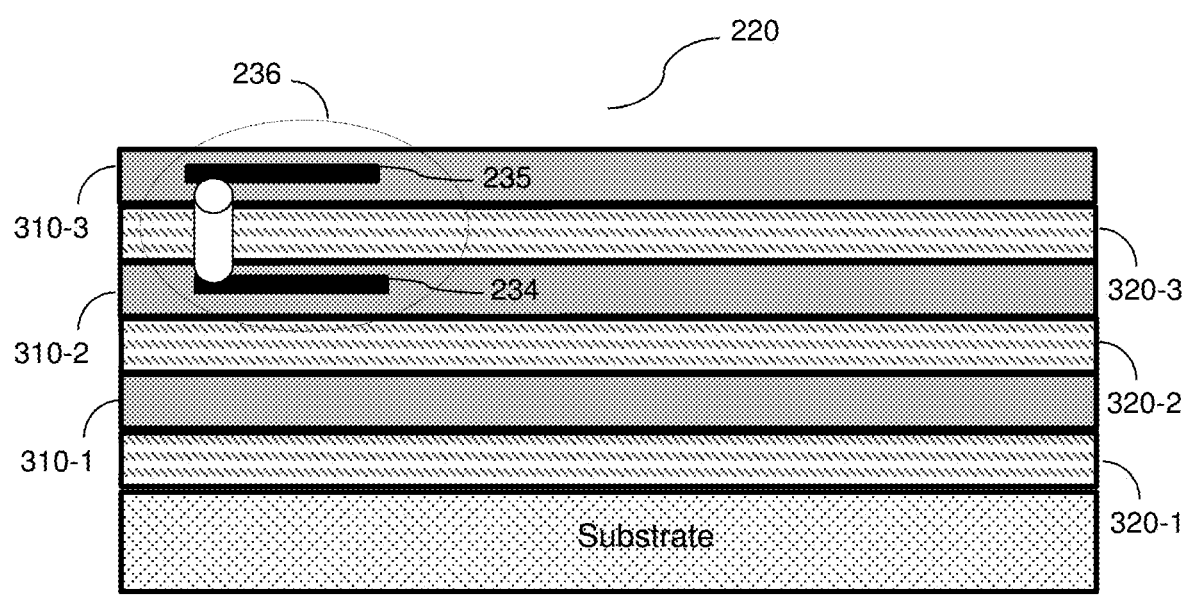

In another embodiment, the metal plates of the on-die capacitor 220 are formed by utilizing only portions of two metal layers 310-2 and 310-3, while the dielectric layer 320-3 is used as the dielectric medium of the capacitor. As illustrated in FIG. 3B, a first portion 234 and a second portion 235 of the top metal layers 310-2 and 310-3, respectively, form a first metal plate 236 of the on-die capacitor 220. A second metal plate of the capacitor is formed using the third metal layer 310-1. A portion of the dielectric layer 320-2 is employed as the dielectric medium of the capacitor 220.

In yet another embodiment, a plurality of portions from multiple layers are utilized to form the on-die capacitor 220. As an example shown in FIG. 3C, a first metal plate 238 of the on-die capacitor 220 is formed using multiple portions of the metal layers 310-1, 310-2, and 310-3, where the portions are connected between the various layer through vias 330. A second metal plate 239 of the on-die capacitor 220 is formed using multiple portions of the same metal layers 310-1, 310-2, and 310-3, the portions of which are likewise connected through vias. Each of the dielectric layers 320-1 through 320-3 serves as part of the dielectric medium of the capacitor 220. The first 238 and second metal layers 239 may be comprised of portions from the same layers, but in no way are limited to such a structure. In further embodiments, the metal plates of the capacitor and located on different metal layers.

In all of the above embodiments, one metal plate is connected to the energy harvester while the other metal plate is grounded.

The design of the on-die capacitor 220, e.g., number of metal layers being used, is based on the specific needs of the on-die capacitor 220. The number of metal layers being utilized determines the capacitance of the capacitor 220. The capacitor 220 can be utilized for energy storage, where a maximum number of metal layers is desirable. For example, in an embodiment, the capacitance of the on-die capacitor 220 may be up to 5 nano-farad (nf) when a maximum number metal layers are utilized.

Alternatively, the on-die capacitor 220 can be utilized for data retention only, thus deigned to maintain a minimal voltage value with a minimal number of metal layers. In some embodiments, an IC (e.g., the IC 200 of FIG. 2) can be designed to include different types of on-die capacitors.

Figure 3C:
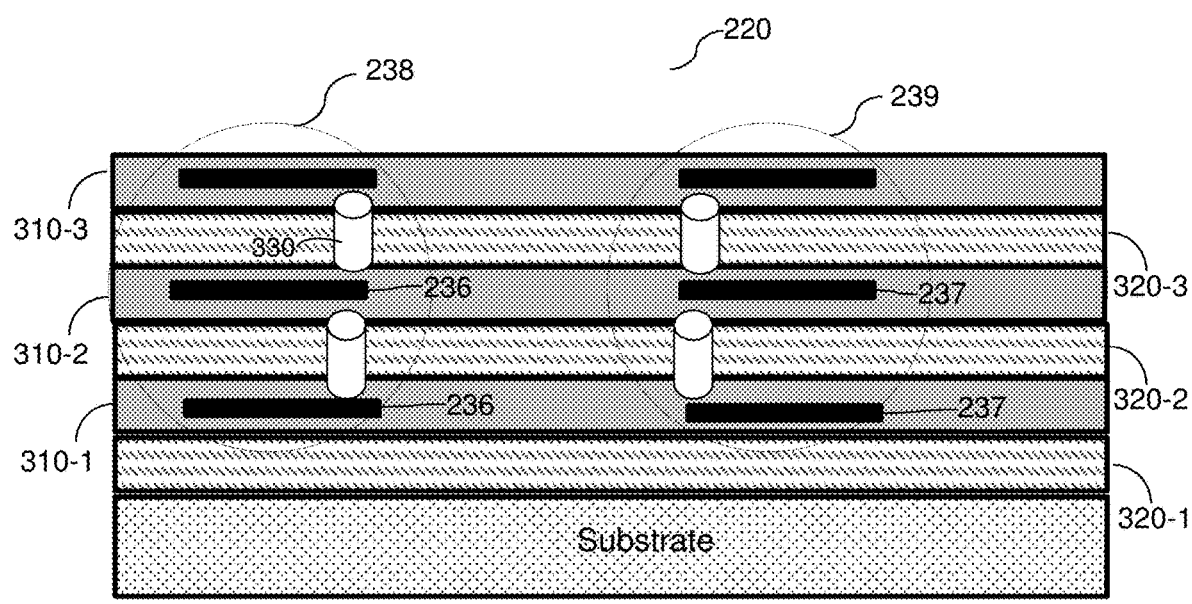

It should be noted that semiconductor devices (e.g., transistors) are not illustrated in FIGS. 3A through 3C for simplicity purposes. However, the layout of the IC 200 would include the various circuits discussed above together with the disclosed on-die capacitor.

It should be further noted that the on-die capacitor 220 is not a CMOS or MOS capacitor, as such capacitor consists of a metal-oxide-semiconductor structure and characterized by high current leakage. This can reduce the overall power maintained by the on-die capacitor 220.

Figure 4:
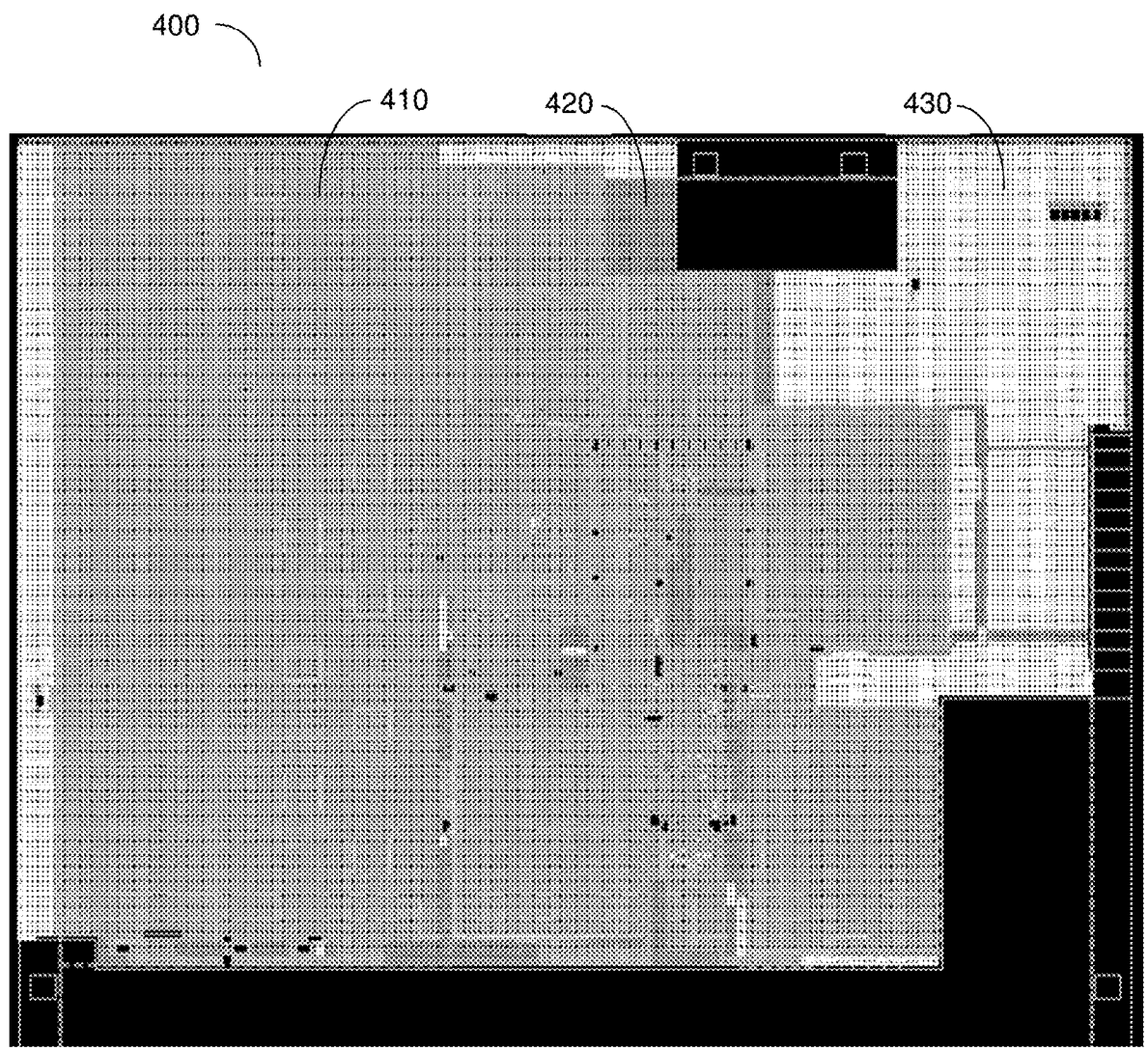
FIG. 4 is a schematic diagram of an on-die capacitor indicating multiple capacitance areas within the die.

FIG. 4 is a schematic diagram of an on-die capacitor 400 indicating multiple capacitance areas within the die. As shown in FIG. 4, various areas within the die 400 are shaded differently, where each shade indicates a difference capacitance distribution. For example, a first area 410 indicates an area on the die 400, e.g., placed over a non-volatile memory, that is capable of storing 230 femtofarads (ff) of capacitance; a second area 420 indicated an area, e.g., placed over routing tunnels, capable of storing 600-650 ff of capacitance, and a third area 430, e.g., unused space of the die, capable of storing 750-850 ff of capacitance. Thus, the sum of the areas having potential capacitance storage within the die is the total capacitance capacity that can be stored within the die.

Figure 5:
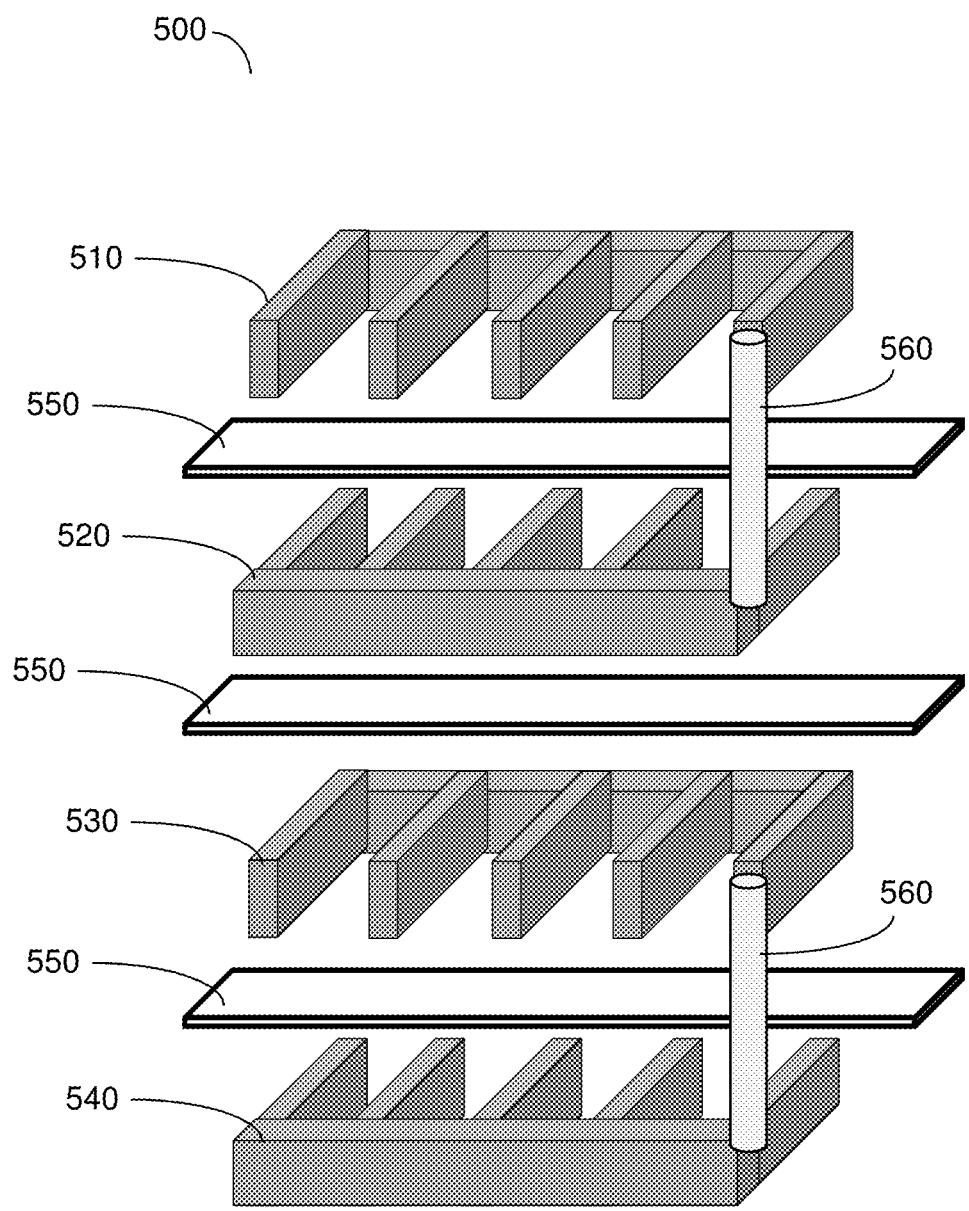
FIG. 5 is a schematic diagram of a multi-level capacitor according to an embodiment.

FIG. 5 is a schematic diagram of a multi-level capacitor 500 according to an embodiment. In some embodiments, the die includes a capacitor with multiple metal layers 510, 520, 530 and 540, where a first metal layer 510 comprises a comb-shaped surface, and a parallel coplanar second metal layer 520 is a similarly comb-shaped surface rotated about an axis perpendicular to the planes in which the layers lie. Similarly, in the shown example, a third metal layer 530 comprises a comb-shaped surface, and a parallel coplanar fourth metal layer 540 is a similarly comb-shaped surface rotated about an axis perpendicular to the planes in which the layers lie. Dielectric surfaces 550 are disposed in between the various metal layers 510, 520, 530 and 540. In an embodiment, one or more vias 560 are used to connect two or more metal layers to create a single metal plate. Thus, in FIG. 5, the first metal layer 510 is joined to the second metal layer 520 to create a first metal plate, and the third metal layer 530 is joined to the fourth metal layer 540 to create a second metal plate. The first metal plate and the second metal plate are then used as the two conductors forming a capacitor. It should be noted that the figure shows two metal plates for simplicity reasons only, and the disclosed embodiment may include a plurality of interconnected metal plates used together to form the capacitor.

Figure 6:
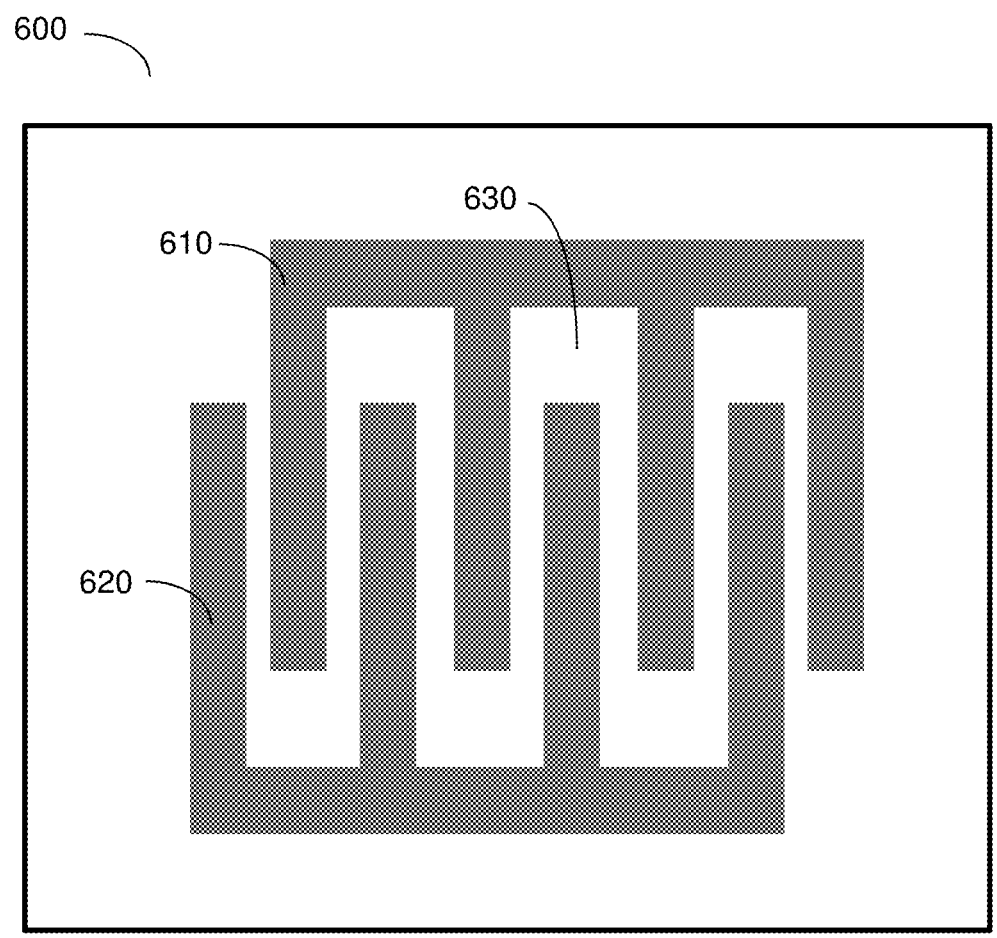
FIG. 6 is a schematic diagram of a single level capacitor according to an embodiment.

FIG. 6 is a schematic diagram of a single level capacitor 600 according to an embodiment. In the shown embodiment, the metal layers are placed within the same plane, where a first metal layer 610 is comprises a comb-shaped surface, and a second metal layer 620 is coplanar and rotated such that the fingers of the first layer 610 are interspersed with the fingers of the second layer 620. The dielectric material 630 is placed in between the fingers of the comb, allowing for the structure of a capacitor 600 to store charge.

As used herein, the phrase "at least one of" followed by a listing of items means that any of the listed items can be utilized individually, or any combination of two or more of the listed items can be utilized. For example, if a system is described as including "at least one of A, B, and C," the system can include A alone; B alone; C alone; A and B in combination; B and C in combination; A and C in combination; or A, B, and C in combination.

All examples and conditional language recited herein are intended for pedagogical purposes to aid the reader in understanding the principles of the disclosed embodiment and the concepts contributed by the inventor to furthering the art, and are to be construed as being without limitation to such specifically recited examples and conditions. Moreover, all statements herein reciting principles, aspects, and embodiments of the disclosed embodiments, as well as specific examples thereof, are intended to encompass both structural and functional equivalents thereof. Additionally, it is intended that such equivalents include both currently known equivalents as well as equivalents developed in the future, i.e., any elements developed that perform the same function, regardless of structure.

What is claimed is:

1. An on-die capacitor for an Internet of Things (IoT) device, comprising:
   an integrated circuit disposed on a die;
   a power management unit; and
   an on-die capacitor, wherein the capacitor further comprises a first metal plate, a second metal plate, and a dielectric material effectively therebetween, wherein the capacitor is integral to the die;
   wherein on the die there is a plurality of interconnecting layers and between each pair of interconnecting layers there is a layer of dielectric, and wherein the first metal plate comprises electrically connected metal portions in each of at least two different ones of the interconnecting layers and the second metal plate comprises electrically connected metal portions in each of at least two different ones of the interconnecting layers that are different from the interconnecting layers of the first metal plate.

2. The on-die capacitor of claim 1, wherein the on-die capacitor is charged through an energy harvester configured to harvest energy from environmental sources, wherein the harvested energy is stored within the on-die capacitor.

3. The on-die capacitor of claim 2, wherein the environmental sources include at least one of: ambient light, mechanical movement, vibrational movement, wind power, and electromagnetic radiation.

4. The on-die capacitor of claim 1, wherein at least one of the first metal plate and the second metal plate comprises a first comb shaped metal portion oriented in a first orientation in one of its interconnecting layers and a second comb shaped metal portion oriented in an opposite direction to the first orientation in the other one of its interconnecting layers so that if the first comb shaped metal portion and the second comb shaped metal portion were in the same plane they would face each other in a manner so as to have interdigitated comb fingers.

5. The on-die capacitor of claim 1, wherein the power management unit is configured to provide multi-level voltage level indications to the integrated circuit.

6. The on-die capacitor of claim 1, wherein the power management unit is realized using a Schmitt trigger configured to operate on a predefined threshold.

7. The on-die capacitor of claim 1, wherein the dielectric material comprises at least one of: silicon dioxide and silicon oxycarbide.

8. The on-die capacitor of claim 1, wherein the on-die capacitor includes multiple capacitance areas within the die, wherein each capacitance area provides a difference capacitance distribution.

9. An on-die capacitor comprising:
a first metal plate;
a second metal plate; and
a dielectric material effectively located between the first metal plate and the second metal plate, wherein the on-die capacitor is integral to a die;
wherein on the die there is a plurality of interconnecting layers and between each pair of interconnecting layers there is a layer of dielectric, and wherein the first metal plate comprises electrically connected metal portions in each of at least two different ones of the interconnecting layers and the second metal plate comprises electrically connected metal portions in each of at least two different ones of the interconnecting layers that are different from the interconnecting layers of the first metal plate.

10. The on-die capacitor of claim 9, wherein at least one of the first metal plate and the second metal plate comprises a first comb shaped metal portion oriented in a first orientation in one of its interconnecting layers and a second comb shaped metal portion oriented in an opposite direction to the first orientation in the other one of its interconnecting layers so that if the first comb shaped metal portion and the second comb shaped metal portion were in the same plane they would face each other in a manner so as to have interdigitated comb fingers.

* * * * *